(12) United States Patent
Hoffmeyer et al.

(10) Patent No.: US 8,085,550 B2
(45) Date of Patent: Dec. 27, 2011

(54) IMPLEMENTING ENHANCED SOLDER JOINT ROBUSTNESS FOR SMT PAD STRUCTURE

(75) Inventors: Mark Kenneth Hoffmeyer, Rochester, MN (US); Steven Paul Ostrander, Poughkeepsie, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 12/410,095

(22) Filed: Mar. 24, 2009

(65) Prior Publication Data

US 2010/0248506 A1  Sep. 30, 2010

(51) Int. Cl.
*H05K 7/10* (2006.01)
(52) U.S. Cl. .................. 361/767; 361/771; 174/261

(58) Field of Classification Search .................. None
See application file for complete search history.

(56) References Cited

U.S. PATENT DOCUMENTS

| | | | | |
|---|---|---|---|---|
| 5,468,919 | A * | 11/1995 | Shiozaki et al. | 174/261 |
| 6,160,713 | A * | 12/2000 | Floyd et al. | 361/760 |
| 6,402,527 | B2 * | 6/2002 | Ota | 439/67 |
| 6,566,611 | B2 * | 5/2003 | Kochanowski et al. | 174/261 |
| 7,393,244 | B1 | 7/2008 | Brodsky et al. | |
| 7,723,855 | B2 * | 5/2010 | Tsai et al. | 257/786 |
| 2008/0266824 | A1 * | 10/2008 | Wang | 361/767 |
| 2009/0279272 | A1 * | 11/2009 | Sun | 361/767 |

* cited by examiner

*Primary Examiner* — Boris Chervinsky
(74) *Attorney, Agent, or Firm* — Joan Pennington

(57) ABSTRACT

A method and a surface mount technology (SMT) pad structure are provided for implementing enhanced solder joint robustness. The SMT pad structure includes a base SMT pad. The base SMT pad receives a connector for soldering to the SMT pad structure. A standoff structure having a selected geometry is defined on the base SMT pad to increase thickness of the solder joint for the connector.

20 Claims, 9 Drawing Sheets

IMPLEMENTING ENHANCED SOLDER JOINT ROBUSTNESS FOR SMT PAD STRUCTURE

FIELD OF THE INVENTION

The present invention relates generally to the data processing field, and more particularly, relates to a method and a surface mount technology (SMT) pad structure for implementing enhanced solder joint robustness.

DESCRIPTION OF THE RELATED ART

Many high performance computer systems and server systems rely on large-scale packaging of multiple high density interconnect modules and printed circuit boards to accommodate efficient interconnection of increasingly complex, high signal speed, integrated circuit devices within a spatial footprint.

Known large scale, high density SMT array connector technology is used to facilitate high speed, high signal integrity bus communications between processor node cards. In some known system applications, a right angle receptacle connector consisting of an array of wafers with insert molded spring beam contacts and SMT connector leads are mounted to the node cards. Node to node communication is provided by docking right angle receptacle connector to header connectors consisting of an array of wafers with insert molded contact blades that are also SMT mounted on mid-plane or backplane cards located within the central electronics complex (CEC) of the computers.

In such system applications, the node cards often are very heavy and require complex mechanical docking systems, guidance features and book packaging to ensure successful and reliable mating of the high speed connectors. As an additional ramification of the large mass of these system planars and node cards, various structural deflections of support hardware and cards can take place, along with some potential for eccentricity of mating faces of the connector system during docking. These aggregate conditions can drive combined tensile and shear stresses on individual connector wafers and their respective SMT solder joints during the docking or seating process.

To minimize these hardware influences and their collective impact on stress transfer to connector wafers, multiple mechanical re-enforcements and design enhancements are implemented within the general mechanical hardware used to dock the node hardware. However, even with optimized hardware for docking the potential for presence of stress components arising on solder joints of the right angle daughter connector array exist, with largest stresses concentrated nearest to the node board edge.

One key reliability concern is the potential for the presence of a significant tensile stress component that creates tensile strain on solder joints and drives potential for solder joint cracks during a connector docking or seating process. If solder joint bond lines are thin, it is possible for both large shear and tensile stresses to arise and create problems as well, from combined effects of connector docking and residual stresses present from connector assembly.

In the large scale, high density SMT array, the connector wafers often are exceedingly complex to produce and possess multiple wafer subcomponent tolerances. Several within wafer, and between wafer position tolerances exist that drive lead co-planarity variability. Moreover, additional tolerances also exist at the connector assembly level, which influence SMT connector lead co-planarity as well.

These aggregate tolerances make achievement of absolute co-planarity of SMT leads across an entire large scale connector body exceedingly difficult. Given these lead co-planarity considerations, a load must be applied across the connector body during SMT solder assembly to ensure intimate and consistent contact of connector SMT leads with the solder paste attach material to ensure assembly success through the reflow process. It is the connector loading process coupled with SMT connector lead to lead co-planarity variation within known connector wafers that creates conditions leading to variable solder joint thickness, where thickness variation of the solder joints creates variability in solder joint strengths.

In general, SMT connector leads which protrude further out from the bottom of the connector body or further out from adjacent leads have a tendency to create thin solder bond lines when the connector is loaded and pressed to the board surface during SMT assembly, while SMT connector leads that are more recessed with respect to the connector body or neighboring leads will possess resultant solder joints with thicker solder bond lines.

In order to ensure improved solder joint strengths, lower internal solder strain levels, and generally more robust solder joint connections, a secondary methodology needs to be created on hardware involved in the interconnect structure to ensure consistently thicker solder bond lines develop during SMT assembly.

SUMMARY OF THE INVENTION

Principal aspects of the present invention are to provide a method and a surface mount technology (SMT) pad structure for implementing enhanced solder joint robustness. Other important aspects of the present invention are to provide such method and SMT pad structure substantially without negative effect and that overcome many of the disadvantages of prior art arrangements.

In brief, a method and a surface mount technology (SMT) pad structure are provided for implementing enhanced solder joint robustness. The SMT pad structure includes a base SMT pad. The base SMT pad receives a connector SMT lead for soldering to the SMT pad structure. A standoff structure having a selected geometry is defined on the base SMT pad to increase thickness of the solder joint for the connector SMT lead.

In accordance with features of the invention, the standoff structure ensures consistently thicker solder bond lines develop during SMT assembly. The standoff structure includes a number of standoff geometries that can be used. The standoff structure is created using selected operations of conventional mask, expose, Cu plate, mask strip, and etch operations that are part of standard printed wiring board manufacturing operations.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and a surface mount technology (SMT) pad structure are provided for implementing enhanced solder joint robustness. A number of selected plating and/or etching sequences are used to form the SMT pad structure. The SMT pad structure provides an SMT lead standoff such that thicker overall solder joints are created for the SMT leads.

Figure 1:
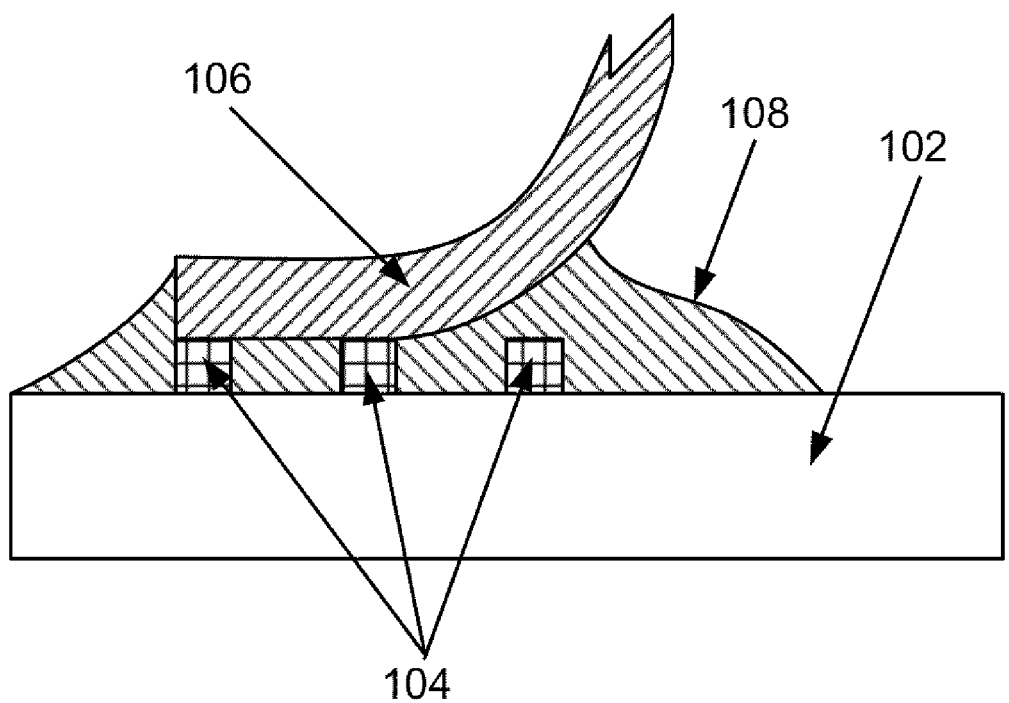
FIG. 1 is a side view of a surface mount technology (SMT) pad structure for implementing enhanced solder joint robustness in accordance with the preferred embodiment.

Having reference now to the drawings, in FIG. 1, there is shown a surface mount technology (SMT) pad structure for implementing enhanced solder joint robustness generally designated by the reference character 100 in accordance with the preferred embodiment.

SMT pad structure 100 includes a base SMT pad 102. A standoff structure 104 having a selected geometry defined on the base SMT pad 102. The base SMT pad 102 receives a connector SMT lead 106 for soldering to the SMT pad structure. The defined standoff structure 104 increases thickness of a solder joint 108 for the connector 106. The solder joint 108 has a minimum increased thickness or bond line thickness difference of, for example, about 25 microns, created by the standoff structure 104. The standoff structure 104 provides a surface texture structure effective to implement enhanced solder joint robustness.

The standoff structure 104 is created using selected conventional mask, expose, Cu plate, mask strip, and/or etch operations that are part of standard printed wiring board manufacturing operations. For example, standoff structures 104 can be created using an additional masking and plating step, or an etching treatment can be used in conjunction with another masking step that occurs before of after final etching of general pad feature shapes, to create features defining the standoff structure 104 in the SMT pads 102 by etching metal away in specific areas as opposed to plating additional material in specific areas on the SMT pads 102.

The base SMT pad 102 is formed, for example, of copper, and the standoff structure 104 also is formed, for example, of copper. The standoff structure 104 is selectively applied to some or all SMT pads 102 within a SMT pad array. The standoff structure 104 has a predefined thickness of, for example, about 25 microns.

It should be understood that the standoff structure 104 could be created also on printed wiring board (PWB) pads used for mounting connector guide blocks to provide a consistent overall connector component seating plane reference. However, use of this treatment on guide block seating pad locations may not be required as minor adjustment of guide block seating reference plane can also be adjusted by other means including addition of shims to board surfaces or by providing minor dimensional changes to actual connector guide block seating areas.

Figure 2A:
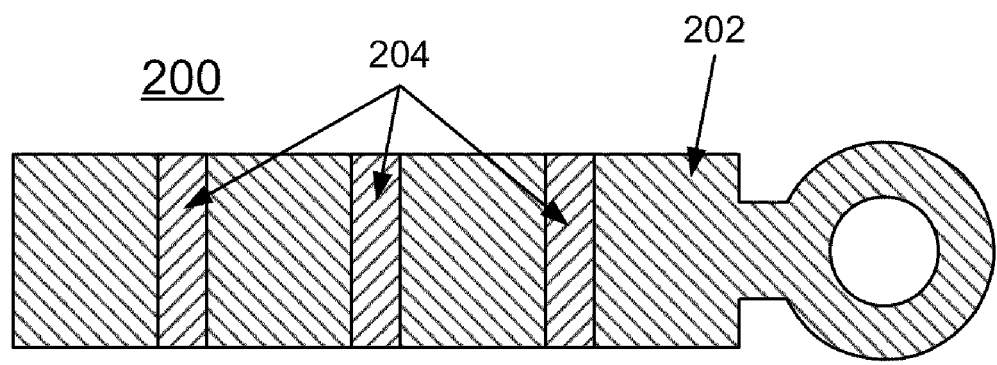
FIGS. 2A and 2B are respective top plan and side views of an example surface mount technology (SMT) pad structure of FIG. 1 in accordance with the preferred embodiment.
Figure 2B:
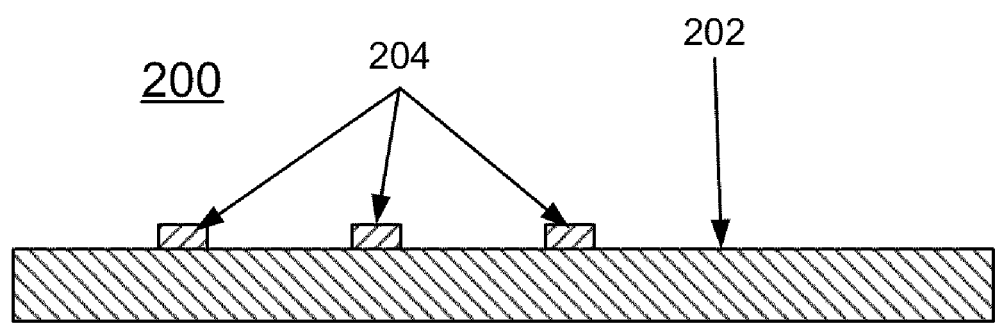

Referring to FIGS. 2A and 2B, there is shown an example surface mount technology (SMT) pad structure generally designated by the reference character 200 in accordance with the preferred embodiment.

SMT pad structure 200 includes a base SMT pad 202. A standoff structure 204 having a selected geometry is defined into the base SMT pad 202. The standoff structure 204 includes a plurality of spaced apart rectangular shapes extending across the width of the base SMT pad 202 and having a predefined thickness to define a SMT lead standoff for implementing enhanced solder joint robustness increasing thickness of a solder joint 108 for the connector SMT lead 106.

Figure 3A:
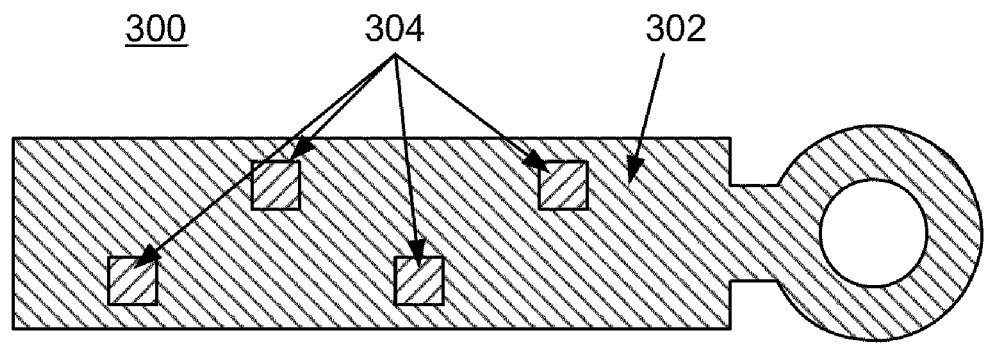
FIGS. 3A and 3B are respective top plan and side views of another example surface mount technology (SMT) pad structure of FIG. 1 in accordance with the preferred embodiment.
Figure 3B:
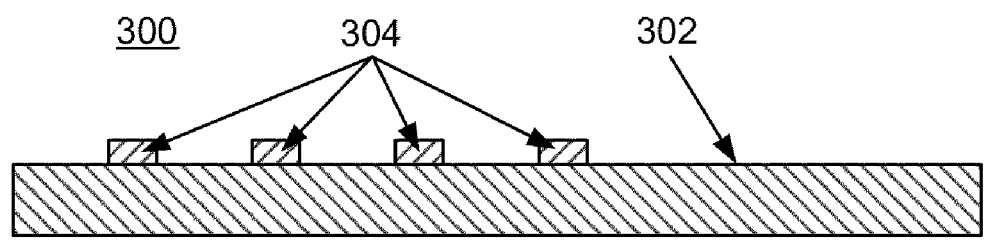

Referring to FIGS. 3A and 3B, there is shown another example surface mount technology (SMT) pad structure of FIG. 1 in accordance with the preferred embodiment.

SMT pad structure 300 includes a base SMT pad 302. A standoff structure 304 having a selected geometry is defined into the base SMT pad 302. The standoff structure 304 includes a plurality of spaced apart staggered square shapes extending in a pair of rows along the length of the base SMT pad 302 and having a predefined thickness to define a SMT lead standoff for implementing enhanced solder joint robustness increasing thickness of a solder joint 108 for the connector SMT lead 106.

Figure 4A:
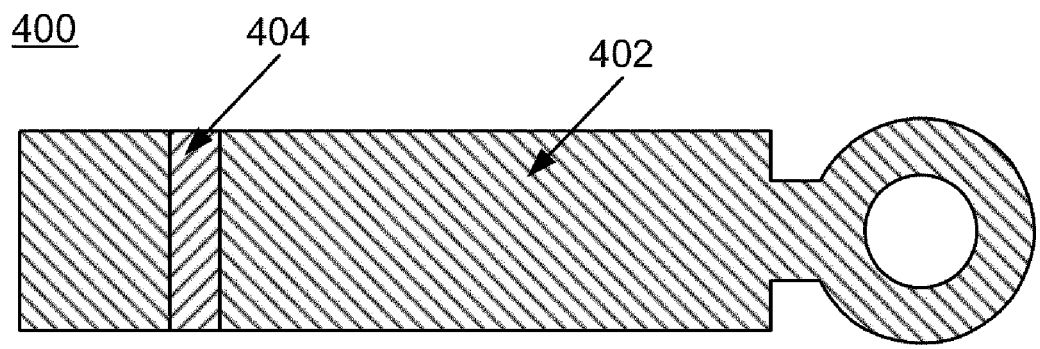
FIGS. 4A and 4B are respective top plan and side views of another example surface mount technology (SMT) pad structure of FIG. 1 in accordance with the preferred embodiment.
Figure 4B:
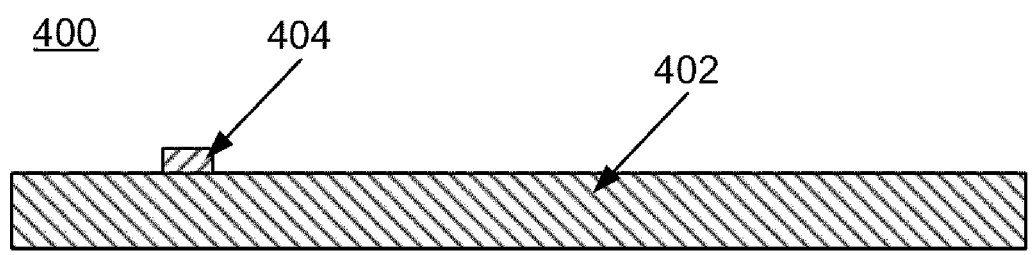

Referring to FIGS. 4A and 4B, there is shown another example surface mount technology (SMT) pad structure generally designated by the reference character 400 in accordance with the preferred embodiment.

SMT pad structure 400 includes a base SMT pad 402. A standoff structure 404 having a selected geometry is defined into the base SMT pad 402. The standoff structure 404 includes a single rectangular shape extending across the width of the base SMT pad 402 and having a predefined thickness to define a SMT lead standoff for implementing enhanced solder joint robustness increasing thickness of a solder joint 108 for the connector SMT lead 106.

Figure 5A:
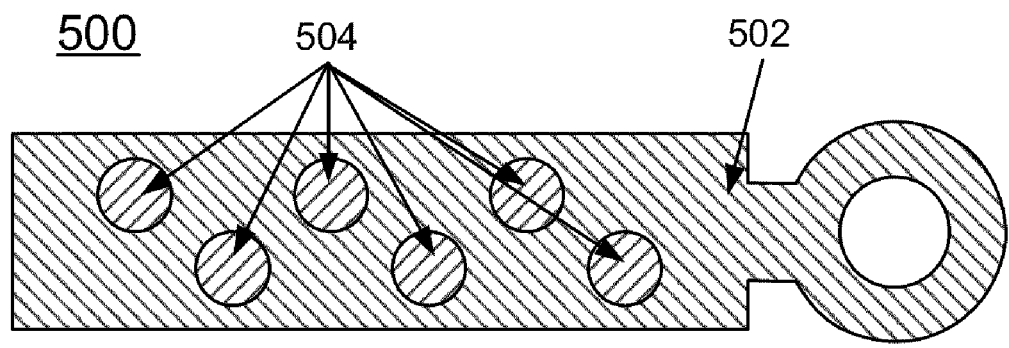
FIGS. 5A and 5B are respective top plan and side views of another example surface mount technology (SMT) pad structure of FIG. 1 in accordance with the preferred embodiment.
Figure 5B:
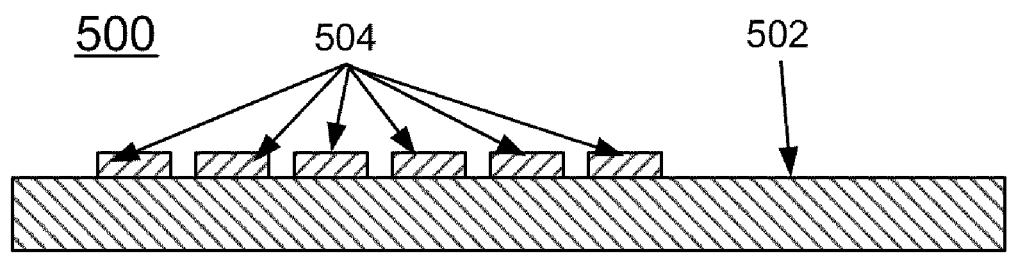

Referring to FIGS. 5A and 5B, there is shown another example surface mount technology (SMT) pad structure generally designated by the reference character 500 in accordance with the preferred embodiment.

SMT pad structure 500 includes a base SMT pad 502. A standoff structure 504 having a selected geometry is defined into the base SMT pad 502. The standoff structure 504 includes a plurality of spaced apart staggered circular shapes extending in a pair of rows along the length of the base SMT pad 502 and having a predefined thickness to define a SMT lead standoff for implementing enhanced solder joint robustness increasing thickness of a solder joint 108 for the connector SMT lead 106.

Figure 6A:
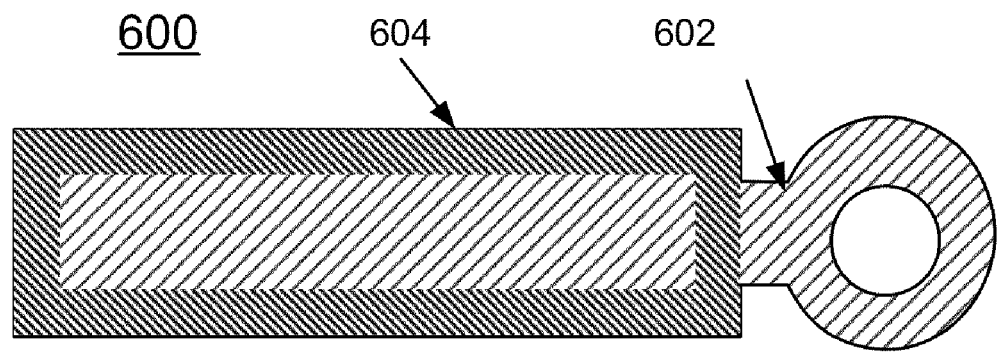
FIGS. 6A and 6B are respective top plan and side views of another example surface mount technology (SMT) pad structure of FIG. 1 in accordance with the preferred embodiment.
Figure 6B:
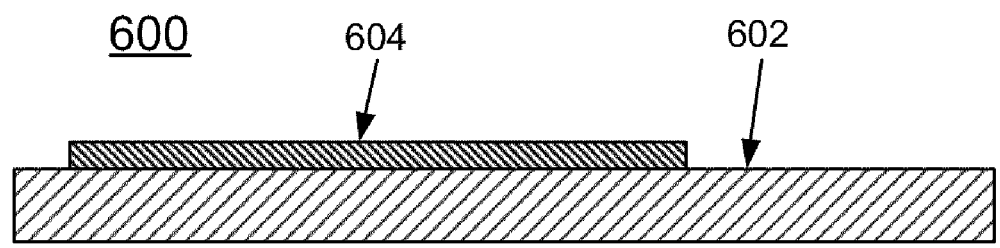

Referring to FIGS. 6A and 6B, there is shown another example surface mount technology (SMT) pad structure generally designated by the reference character 600 in accordance with the preferred embodiment.

SMT pad structure 600 includes a base SMT pad 602. A standoff structure 604 having a selected geometry is defined into the base SMT pad 602. The standoff structure 604 includes an open rectangular shape extending around the perimeter of the base SMT pad 602 and having a predefined thickness to define a SMT lead standoff for implementing enhanced solder joint robustness increasing thickness of a solder joint 108 for the connector SMT lead 106.

Figure 7A:
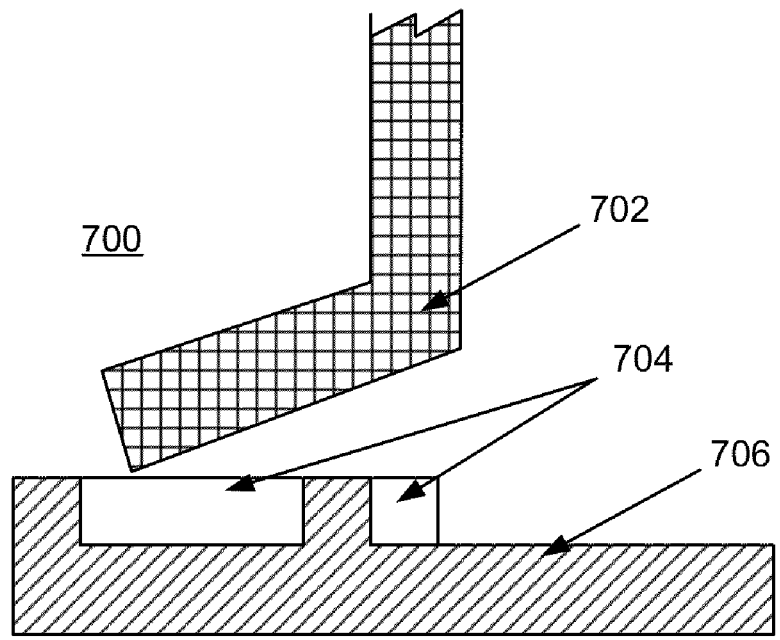
FIGS. 7A and 7B are respective side and top plan views of another example surface mount technology (SMT) pad structure further avoiding ploughing in accordance with the preferred embodiment.
Figure 7B:
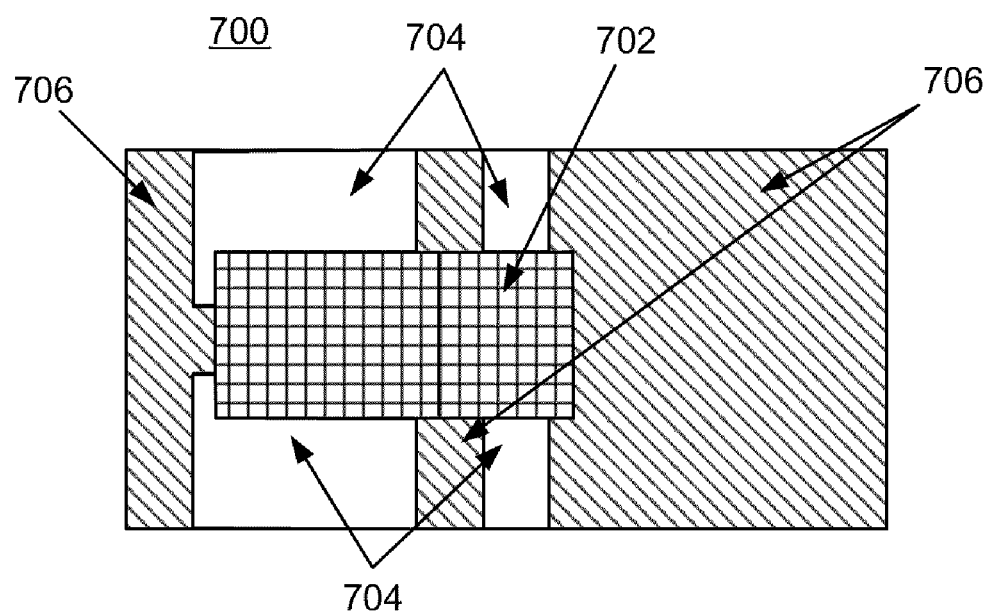

Referring to FIGS. 7A and 7B, there is shown another example surface mount technology (SMT) pad structure generally designated by the reference character 700 further avoiding ploughing in accordance with the preferred embodiment.

SMT pad structure 700 includes a base SMT pad 702. A standoff structure 704 having a selected geometry is defined into the base SMT pad 702. The standoff structure 704 includes a plurality of spaced apart rectangular shapes extending across the width of the base SMT pad 702 and a generally central rectangular shape extending along a portion of the length of the base SMT pad 702 to avoid ploughing of the connector 106. The standoff structure 704 has a predefined thickness to define a SMT lead standoff for implementing enhanced solder joint robustness increasing thickness of a solder joint 108 for the connector SMT lead 106.

Figure 8A:
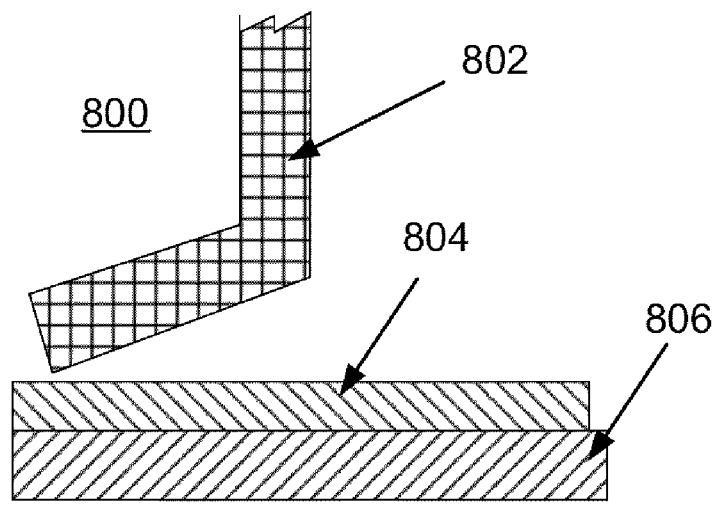
FIGS. 8A and 8B are respective side and top plan views of another example surface mount technology (SMT) pad structure further avoiding ploughing in accordance with the preferred embodiment.
Figure 8B:
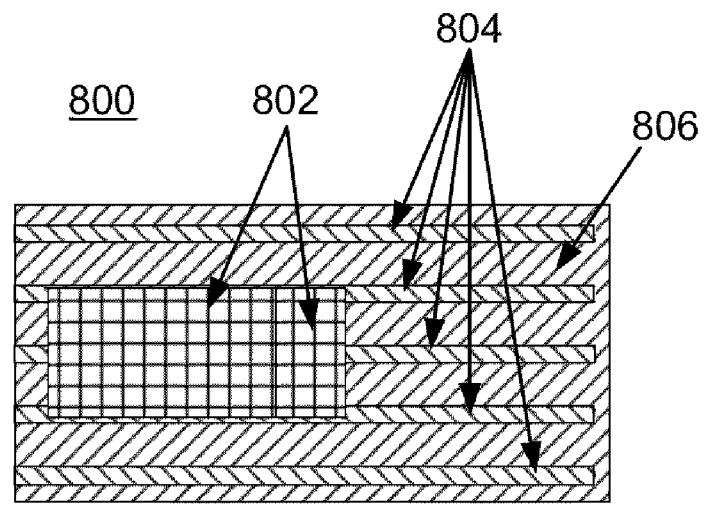

Referring to FIGS. 8A and 8B, there is shown another example surface mount technology (SMT) pad structure generally designated by the reference character 800 further avoiding ploughing in accordance with the preferred embodiment.

SMT pad structure 800 includes a base SMT pad 802. A standoff structure 804 having a selected geometry is defined into the base SMT pad 802. The standoff structure 804 includes a plurality of spaced apart rectangular shapes extending along a portion of the length of the base SMT pad 802 to avoid ploughing of the connector 106, without any cross offsets. The standoff structure 704 has a predefined thickness to define a SMT lead standoff for implementing enhanced solder joint robustness increasing thickness of a solder joint 108 for the connector SMT lead 106.

Figure 9A:
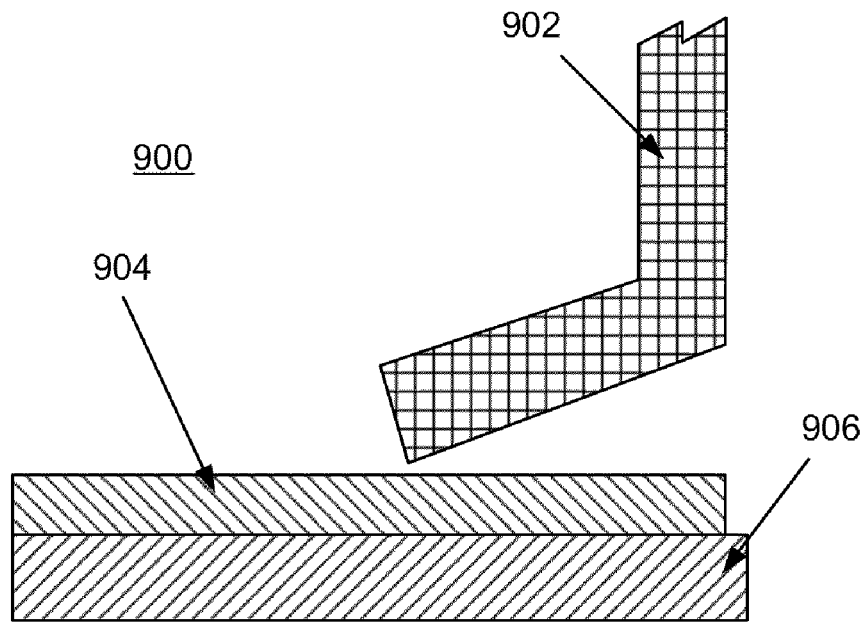
FIGS. 9A and 9B are respective side and top plan views of another example surface mount technology (SMT) pad structure further avoiding ploughing in accordance with the preferred embodiment.
Figure 9B:
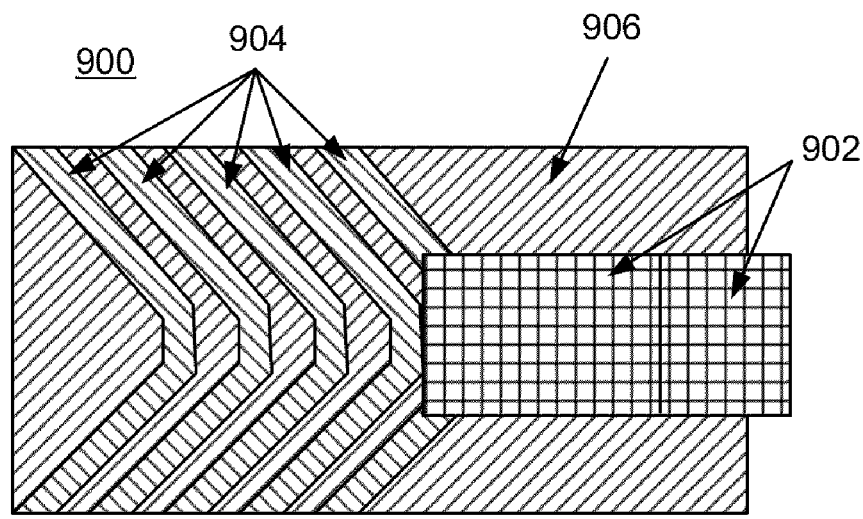

Referring to FIGS. 9A and 9B there is shown another example surface mount technology (SMT) pad structure generally designated by the reference character 900 further avoiding ploughing in accordance with the preferred embodiment.

SMT pad structure 900 includes a base SMT pad 902. A standoff structure 904 having a selected geometry is defined into the base SMT pad 902. The standoff structure 904 includes a plurality of spaced apart and angled rectangular shapes with generally central cross offset portions extending along a portion of the length of the base SMT pad 902 at a selected angle to avoid ploughing of the connector 106, and providing multiple sliding supports. The standoff structure 904 a predefined thickness to define a SMT lead standoff for implementing enhanced solder joint robustness increasing thickness of a solder joint 108 for the connector SMT lead 106.

In accordance with features of the invention, each SMT pad structure 100, 200, 300, 400, 500, 600, 700, 800 and 900 advantageously is formed or defined as part of standard printed wiring board manufacturing operations. Each SMT standoff structure 104, 204, 304, 404, 504, 604, 704, 804 and 904 advantageously is formed of copper carried by a respective copper SMT pad. The standoff structures 104, 204, 304, 404, 504, 604, 704, 804 and 904 can be applied to all pads within an SMT pad array, or can be selectively applied, for example, to signal or ground pads.

In accordance with features of the invention, each SMT standoff structure 104, 204, 304, 404, 504, 604, 704, 804 and 904 is formed, for example, of copper on top of the respective Cu SMT pad, and can be created by using an additional masking and Cu plating step after the final surfaces features of an associated card (not shown) are etched. SMT pad structure 200 can be made simultaneously during a mask and via plating step, prior to final etch of the card surface features. A Cu etching treatment can be used in conjunction with another masking step that occurs prior to final etching to create features in the pads by etching metal away in specific areas as opposed to plating additional material in specific areas. Also an etching treatment can be used in conjunction with another masking step that occurs after final etching of general pad feature shapes to etch in specific patterns on the SMT pads.

In accordance with features of the invention, using each SMT pad structure 100, 200, 300, 400, 500, 600, 700, 800 and 900 after final solder mask and solderability finishes are added to the board, connector attachment occurs via usual methodology via screen printing of solder paste onto the card, followed by component placement and subsequent solder reflow processing.

In accordance with features of the invention, the SMT pad structures 100, 200, 300, 400, 500, 600, 700, 800 and 900 advantageously can be used for generally any SMT component to ensure thicker, more robust solder joint terminations including peripheral leaded devices possessing numerous lead geometries, or devices that used various forms of SMT array pins, columns or balls for solder interconnect.

While the present invention has been described with reference to the details of the embodiments of the invention shown in the drawing, these details are not intended to limit the scope of the invention as claimed in the appended claims.

What is claimed is:

1. A surface mount technology (SMT) pad structure for implementing enhanced solder joint robustness comprising:
   a base SMT pad, said base SMT pad receiving a SMT connector lead for soldering to said base SMT pad; and
   a standoff structure having a selected geometry; said standoff structure being defined on said base SMT pad to increase thickness of the solder joint for the connector.

2. The SMT pad structure as recited in claim 1 wherein said base SMT pad includes a rectangular shaped copper pad.

3. The SMT pad structure as recited in claim 1 wherein said standoff structure includes a plurality of spaced apart rectangular shapes extending across a width of said base SMT pad.

4. The SMT pad structure as recited in claim 1 wherein said standoff structure having a predefined thickness to define a SMT lead standoff for implementing enhanced solder joint robustness.

5. The SMT pad structure as recited in claim 1 wherein said standoff structure includes a predefined thickness of about 25 microns.

6. The SMT pad structure as recited in claim 1 wherein said standoff structure includes an open rectangular shape extending around the perimeter of the base SMT pad.

7. The SMT pad structure as recited in claim 1 wherein said standoff structure includes a rectangular shape.

8. The SMT pad structure as recited in claim 1 wherein said standoff structure includes a plurality of spaced apart rectangular shapes extending along a length portion of said base SMT pad.

9. The SMT pad structure as recited in claim 7 wherein said standoff structure further includes at least one rectangular shape extending across a width of said base SMT pad.

10. The SMT pad structure as recited in claim 1 wherein said standoff structure includes a plurality of spaced apart circular shapes extending along a length portion of said base SMT pad.

11. The SMT pad structure as recited in claim 1 wherein said standoff structure includes a plurality of spaced apart and angled rectangular shapes with generally central cross offset portions extending along a length portion of said base SMT pad.

12. A method for implementing enhanced solder joint robustness with a surface mount technology (SMT) pad structure including a base SMT pad, said base SMT pad receiving a connector for soldering to said base SMT pad, said method comprising the steps of:
creating a standoff structure on the base SMT pad, and
providing said standoff structure with a selected geometry to increase thickness of the solder joint for the connector.

13. The method for implementing enhanced solder joint robustness with the SMT pad structure as recited in claim 12 includes providing said standoff structure with a predefined thickness to define a SMT lead standoff for implementing enhanced solder joint robustness.

14. The method for implementing enhanced solder joint robustness with the SMT pad structure as recited in claim 12 includes providing said standoff structure with a predefined thickness of about 25 microns.

15. The method for implementing enhanced solder joint robustness with the SMT pad structure as recited in claim 12 wherein providing said standoff structure with a selected geometry to increase thickness of the solder joint for the connector includes providing a plurality of spaced apart rectangular shapes extending across a width portion of said base SMT pad.

16. The method for implementing enhanced solder joint robustness with the SMT pad structure as recited in claim 12 wherein creating a standoff structure on the base SMT pad includes creating a standoff structure formed of copper on the base SMT pad.

17. The method for implementing enhanced solder joint robustness with the SMT pad structure as recited in claim 12 wherein providing said standoff structure with a selected geometry to increase thickness of the solder joint for the connector includes providing a plurality of spaced apart rectangular shapes extending along a length portion of said base SMT pad.

18. The method for implementing enhanced solder joint robustness with the SMT pad structure as recited in claim 12 wherein providing said standoff structure with a selected geometry to increase thickness of the solder joint for the connector includes providing a plurality of spaced apart circular shapes extending along a length portion of said base SMT pad.

19. The method for implementing enhanced solder joint robustness with the SMT pad structure as recited in claim 12 wherein providing said standoff structure with a selected geometry to increase thickness of the solder joint for the connector includes providing at least one rectangular shape extending across a width portion of said base SMT pad.

20. The method for implementing enhanced solder joint robustness with the SMT pad structure as recited in claim 12 wherein providing said standoff structure with a selected geometry to increase thickness of the solder joint for the connector includes providing a plurality of spaced apart and angled rectangular shapes with generally central cross offset portions extending along a length portion of said base SMT pad.

* * * * *